(12) United States Patent
Feng et al.

(10) Patent No.: US 11,417,263 B2
(45) Date of Patent: Aug. 16, 2022

(54) SHIFT REGISTER UNIT AND METHOD FOR DRIVING THE SAME, GATE DRIVE CIRCUIT AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Jingyi Feng, Beijing (CN); Yingsong Xu, Beijing (CN); Jiandong Bao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/216,852

(22) Filed: Mar. 30, 2021

(65) Prior Publication Data

US 2022/0036798 A1 Feb. 3, 2022

(30) Foreign Application Priority Data

Jul. 30, 2020 (CN) .......................... 202010751532.4

(51) Int. Cl.
*G09G 3/3266* (2016.01)
*G09G 3/20* (2006.01)
*G11C 19/28* (2006.01)

(52) U.S. Cl.
CPC .......... *G09G 3/2092* (2013.01); *G11C 19/28* (2013.01); *G09G 2300/0426* (2013.01); *G09G 2310/0286* (2013.01); *G09G 2310/08* (2013.01)

(58) Field of Classification Search
CPC ......... G09G 3/2092; G09G 2300/0426; G09G 2310/0286; G09G 2310/08; G09G 3/20;
(Continued)

(56) References Cited

U.S. PATENT DOCUMENTS 10,283,211 B2 * 5/2019 Ma .......................... G11C 19/28
10,497,454 B2 * 12/2019 Ma ....................... H01L 27/1214
(Continued)

FOREIGN PATENT DOCUMENTS

CN 105321490 A 2/2016
CN 105654905 A 6/2016
(Continued)

OTHER PUBLICATIONS

China Patent Office, First Office Action dated Mar. 18, 2021 for application No. CN202010751532.4.

*Primary Examiner* — Jose R Soto Lopez
(74) *Attorney, Agent, or Firm* — Houtteman Law LLC (57) ABSTRACT

The present disclosure provides a shift register unit, including: a first input sub-circuit configured to conduct a first voltage terminal with a first node under control of a first clock signal terminal; a first output sub-circuit configured to conduct a second voltage terminal with an output terminal under control of the first node; a second input sub-circuit configured to conduct an input terminal with a second node under control of the first clock signal terminal; a second output sub-circuit configured to conduct a second clock signal terminal with the output terminal under control of the second node; a first switching sub-circuit configured to conduct the first clock signal terminal with the first node under control of the second node; a second switching sub-circuit configured to conduct a third clock signal terminal with the storage sub-circuit under control of the first node.

16 Claims, 3 Drawing Sheets

(58) Field of Classification Search
CPC ......... G09G 3/3266; G09G 2300/0408; G09G 2310/0267; G11C 19/28
See application file for complete search history.

(56) References Cited

U.S. PATENT DOCUMENTS

| | | | | |
|---|---|---|---|---|
| 10,540,923 | B2* | 1/2020 | Ma | G09G 3/2092 |
| 2005/0008114 | A1* | 1/2005 | Moon | G11C 19/184 377/64 |
| 2005/0220262 | A1* | 10/2005 | Moon | G11C 19/28 377/64 |
| 2013/0002310 | A1* | 1/2013 | Liu | G09G 3/3677 327/109 |
| 2013/0027377 | A1* | 1/2013 | Yang | G09G 3/3677 345/212 |
| 2013/0044854 | A1* | 2/2013 | Yonemaru | G11C 19/184 377/64 |
| 2013/0136224 | A1* | 5/2013 | Qing | G11C 19/28 377/64 |
| 2014/0125648 | A1* | 5/2014 | Chung | G09G 3/3677 345/213 |
| 2015/0213746 | A1* | 7/2015 | Kim | G11C 19/28 345/215 |
| 2016/0035262 | A1* | 2/2016 | Lee | G09G 3/3266 345/690 |
| 2016/0180800 | A1* | 6/2016 | Zheng | G11C 19/28 377/64 |
| 2016/0293090 | A1* | 10/2016 | Long | G09G 3/2092 |
| 2017/0154602 | A1* | 6/2017 | Sun | G09G 3/20 |
| 2017/0186360 | A1* | 6/2017 | Ma | G09G 3/3266 |
| 2017/0287393 | A1* | 10/2017 | Ma | G09G 3/3266 |
| 2017/0330633 | A1* | 11/2017 | Sun | G11C 19/28 |
| 2018/0091151 | A1* | 3/2018 | Zheng | H03K 19/096 |
| 2018/0182299 | A1* | 6/2018 | Li | G11C 19/28 |
| 2018/0233209 | A1* | 8/2018 | Ma | H01L 27/1214 |
| 2018/0357974 | A1* | 12/2018 | Zheng | G09G 3/36 |
| 2018/0374410 | A1* | 12/2018 | Zhu | G09G 3/2092 |
| 2019/0066604 | A1* | 2/2019 | Kong | G09G 3/3266 |
| 2019/0259321 | A1* | 8/2019 | Kim | G09G 3/3677 |
| 2019/0347997 | A1* | 11/2019 | Park | G09G 3/3266 |
| 2019/0378463 | A1* | 12/2019 | Chung | G09G 3/3225 |
| 2020/0135825 | A1* | 4/2020 | Cha | H01L 27/1255 |
| 2020/0175913 | A1* | 6/2020 | Kang | G09G 3/32 |
| 2020/0202779 | A1* | 6/2020 | Chang | G09G 3/20 |
| 2020/0211467 | A1* | 7/2020 | Kang | G09G 3/3266 |
| 2021/0201813 | A1* | 7/2021 | Oh | G09G 3/3233 |
| 2021/0358365 | A1* | 11/2021 | Feng | G11C 19/287 |
| 2021/0358386 | A1* | 11/2021 | Cao | G09G 3/20 |
| 2021/0383760 | A1* | 12/2021 | In | G09G 3/3266 |

FOREIGN PATENT DOCUMENTS

| | | |
|---|---|---|
| CN | 105976749 A | 9/2016 |
| CN | 106057143 A | 10/2016 |
| CN | 106782338 A | 5/2017 |
| CN | 107039014 A | 8/2017 |
| CN | 110491329 A | 11/2019 |

* cited by examiner

SHIFT REGISTER UNIT AND METHOD FOR DRIVING THE SAME, GATE DRIVE CIRCUIT AND DISPLAY DEVICE

CROSS-REFERENCE TO RELATED APPLICATIONS

The present application claims the priority of Chinese Patent Application No. 202010751532.4, filed on Jul. 30, 2020, the contents of which are incorporated herein in their entirety by reference.

TECHNICAL FIELD

The present disclosure relates to the field of display technology, and in particular to a shift register unit, a method for driving the shift register unit, a gate driving circuit and a display device.

BACKGROUND

An active matrix driving organic light emitting diode (AMOLED) display device has advantages of low manufacturing cost, high response speed, power saving, direct current driving applicable to portable devices, a wide operating temperature range, and the like, and thus is increasingly applied to the field of high performance display.

SUMMARY

The present disclosure provides a shift register unit, which includes: a first input sub-circuit, a first output sub-circuit, a second input sub-circuit, a second output sub-circuit, the first switching sub-circuit, the second switching sub-circuit and a storage sub-circuit, the first input sub-circuit, the first output sub-circuit, the first switching sub-circuit and the second switching sub-circuit are coupled to a first node, the second input sub-circuit, the second output sub-circuit, the first switching sub-circuit and the storage sub-circuit are coupled to a second node, and a first terminal of the storage sub-circuit is coupled to the second switching sub-circuit;

the first input sub-circuit is configured to: in response to a control of a first clock signal terminal, conduct a first voltage terminal with the first node;

the first output sub-circuit is configured to: in response to a control of an electric potential of the first node, conduct a second voltage terminal with an output terminal of the shift register unit;

the second input sub-circuit is configured to: in response to the control of the first clock signal terminal, conduct an input terminal of the shift register unit with the second node;

the second output sub-circuit is configured to: in response to a control of an electric potential of the second node, conduct a second clock signal terminal with the output terminal of the shift register unit;

the first switching sub-circuit is configured to: in response to the control of the electric potential of the second node, conduct the first clock signal terminal with the first node;

the second switching sub-circuit is configured to: in response to the control of the electric potential of the first node, conduct a third clock signal terminal with the first terminal of the storage sub-circuit.

In some implementations, the first clock signal terminal is shared with the third clock signal terminal, and the first clock signal terminal and the second clock signal terminal alternately provide an active level signal.

In some implementations, the first switching sub-circuit includes a first switching transistor, a first electrode of the first switching transistor is coupled to the first clock signal terminal, a second electrode of the first switching transistor is coupled to the first node, and a gate electrode of the first switching transistor is coupled to the second node;

the second switching sub-circuit includes a second switching transistor, the storage sub-circuit includes a first capacitor, a first electrode of the second switching transistor is coupled to the third clock signal terminal, a second electrode of the second switching transistor is coupled to a first terminal of the first capacitor, a gate electrode of the second switching transistor is coupled to the first node, and a second terminal of the first capacitor is coupled to the second node.

In some implementations, the first switching transistor has a greater width-to-length ratio than the second switching transistor.

In some implementations, the second output sub-circuit includes a second output transistor and a second capacitor, a first electrode of the second output transistor and one terminal of the second capacitor are both coupled to the second clock signal terminal, a second electrode of the second output transistor is coupled to the output terminal of the shift register unit, and a gate electrode of the second output transistor and another terminal of the second capacitor are both coupled to the second node.

In some implementations, the first output sub-circuit includes a first output transistor and a third capacitor, a first electrode of the first output transistor and the second voltage terminal are both coupled to one terminal of the third capacitor, a second electrode of the first output transistor is coupled to the output terminal of the shift register unit, and a gate electrode of the first output transistor and another terminal of the third capacitor are both coupled to the first node.

In some implementations, the first input sub-circuit includes a first input transistor having a first electrode coupled to the first voltage terminal, a second electrode coupled to the first node, and a gate electrode coupled to the first clock signal terminal.

In some implementations, the second input sub-circuit includes a second input transistor, a first electrode of the second input transistor is coupled to the input terminal of the shift register unit, a second electrode of the second input transistor is coupled to the second node, and a gate electrode of the second input transistor is coupled to the first clock signal terminal.

The present disclosure further provides a shift register unit, including a first input transistor, a second input transistor, a first output transistor, a second output transistor, a first switching transistor, a second switching transistor, a first capacitor, a second capacitor, and a third capacitor, where, a first electrode of the first input transistor is coupled to a first voltage terminal, a second electrode of the first input transistor is coupled to a first node, a gate electrode of the first input transistor is coupled to a first clock signal terminal, a first electrode of the second input transistor is coupled to an input terminal of the shift register unit, a second electrode of the second input transistor is coupled to a second node, a gate electrode of the second input transistor is coupled to the first clock signal terminal, a first electrode of the first output transistor and one terminal of the third capacitor are both coupled to a second voltage terminal, a second electrode of the first output transistor is coupled to an output terminal of the shift register unit, a gate electrode of the first output transistor and another terminal of the third capacitor are both coupled to the first node, a first electrode of the second output transistor and one terminal of the second capacitor are both coupled to a second clock signal terminal, a second electrode of the second output transistor is coupled to the output terminal of the shift register unit, a gate electrode of the second output transistor and another terminal of the second capacitor are both coupled to the second node, a first electrode of the first switching transistor is coupled to the first clock signal terminal, a second electrode of the first switching transistor is coupled to the first node, a gate electrode of the first switching transistor is coupled to the second node, a first electrode of the second switching transistor is coupled to a third clock signal terminal, a second electrode of the second switching transistor is coupled to a first terminal of the first capacitor, a gate electrode of the second switching transistor is coupled to the first node, a second terminal of the first capacitor is coupled to the second node, and the first clock signal terminal and the third clock signal terminal are shared.

The present disclosure further provides a method for driving the shift register unit described above, the first voltage terminal provides an active level signal, the second voltage terminal provides an inactive level signal, and the first clock signal terminal and the third clock signal terminal are shared, and the driving method includes:

in an input stage, providing an active level signal to the first clock signal terminal and providing an active level signal to the input terminal of the shift register unit, so that the first input sub-circuit conducts the first voltage terminal with the first node, and the second input sub-circuit conducts the input terminal of the shift register unit with the second node;

in an output stage, providing an active level signal to the second clock signal terminal and providing an inactive level signal to the first clock signal terminal, so that the first switching sub-circuit conducts the first clock signal terminal with the first node, the first output sub-circuit cuts off the second voltage terminal from the output terminal of the shift register unit, and the second output sub-circuit conducts the second clock signal terminal with the output terminal of the shift register unit;

in a first noise reduction stage, providing an inactive level signal to the input terminal of the shift register unit, providing an active level signal to the first clock signal terminal, and providing an inactive level signal to the second clock signal terminal to cause the first input sub-circuit to conduct the first voltage terminal with the first node, the second input sub-circuit conducts the input terminal of the shift register unit with the second node, the first output sub-circuit conducts the second voltage terminal with the output terminal of the shift register unit, the second output sub-circuit cuts off the second clock signal terminal from the output terminal of the shift register unit, the first switching sub-circuit cuts off the first clock signal terminal from the first node, and the second switching sub-circuit conducts the first clock signal terminal with the first terminal of the storage sub-circuit;

in a second noise reduction stage, providing an active level signal to the second clock signal terminal, and providing an inactive level signal to the first clock signal terminal, so that the first input sub-circuit cuts off the first voltage terminal from the first node, the second input sub-circuit cuts off the input terminal of the shift register unit from the second node, the second switching sub-circuit conducts the first clock signal terminal with the first terminal of the storage sub-circuit, the first output sub-circuit conducts the second voltage terminal with the output terminal of the shift register unit, and the second output sub-circuit cuts off the second clock signal terminal from the output terminal of the shift register unit.

The present disclosure further provides a gate driving circuit, which includes a plurality of shift register units, where at least one of the shift register units is the shift register unit described above, an input terminal of the shift register unit of a first stage is coupled to a start signal terminal, and an input terminal of the shift register unit of each stage, except the shift register unit of the first stage, is coupled to an output terminal of the shift register unit of a previous stage.

The present disclosure further provides a display device including the gate driving circuit descried above.

DESCRIPTION OF DRAWINGS

The accompanying drawings, which are included to provide a further understanding of the present disclosure and are incorporated in and constitute a part of this specification, together with the embodiments of the present disclosure, serve to explain the present disclosure, but do not constitute a limitation of the present disclosure. In the drawings.

DESCRIPTION OF EMBODIMENTS

The following detailed description of the embodiments of the present disclosure refers to the accompanying drawings. It should be understood that the detailed description and specific embodiments are given by way of illustration and explanation only, not limitation.

Unless otherwise defined, technical or scientific terms used in the embodiments of the present disclosure should have the ordinary meaning as understood by one of ordinary skill in the art to which the present disclosure belongs. The use of "first", "second," and the like in the present disclosure is not intended to indicate any order, quantity, or importance, but rather is used to distinguish one element from another. Similarly, the word "include" or "comprise", and the like, means that the element or item preceding the word includes the element or item listed after the word and its equivalent, but does not exclude other elements or items. The term "coupled" or the like is not restricted to physical or mechanical connections, but may include electrical connections, whether direct or indirect.

In addition, in the present disclosure, the words "conduct(s) A with B" or "A is conducted with B" or the like means that a current is flowing between A and B, and the words "cut(s) off A from B" or the like means that no current is flowing between A and B.

Figure 1:
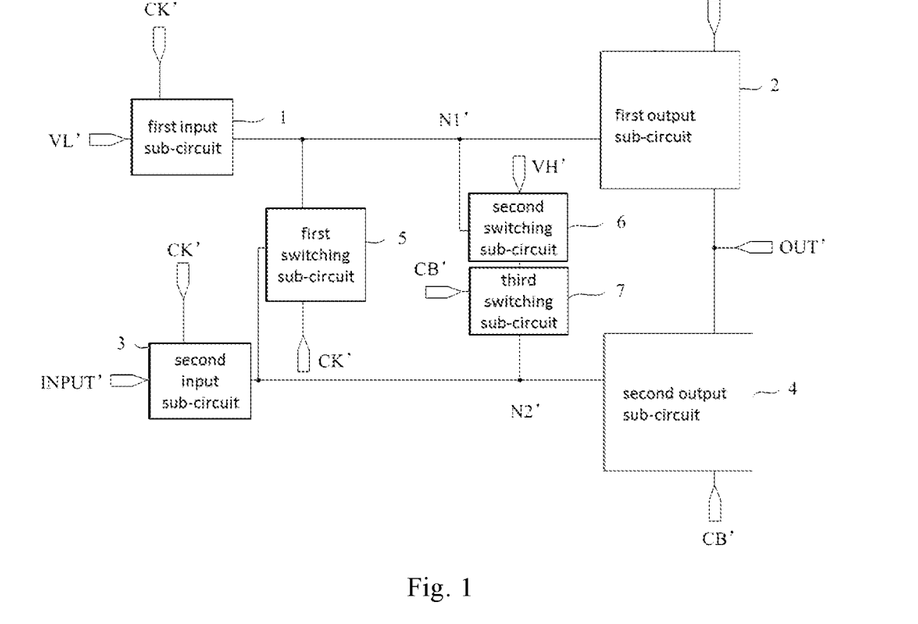
FIG. 1 is a schematic structural diagram of a shift register unit.

FIG. 1 is a schematic structural diagram of a shift register unit, as shown in FIG. 1, the shift register unit includes: a first input sub-circuit 1, a first output sub-circuit 2, a second input sub-circuit 3, a second output sub-circuit 4, a first switching sub-circuit 5, a second switching sub-circuit 6 and a third switching sub-circuit 7. The first input sub-circuit 1, the first output sub-circuit 2, the first switching sub-circuit 5, and the second switching sub-circuit 6 are coupled to a first node N1', and the second input sub-circuit 3, the second output sub-circuit 4, the first switching sub-circuit 5, and the third switching sub-circuit 7 are coupled to a second node N2'. The first input sub-circuit 1 is configured to: in response to a control of a first clock signal terminal CK', conduct a first voltage terminal VL' with the first node N1'. The first output sub-circuit 2 is configured to: in response to a control of an electric potential of the first node N1', conduct a second voltage terminal VH' with an output terminal OUT'. The second input sub-circuit 3 is configured to: in response to the control of the first clock signal terminal CK', conduct an input terminal INPUT' with the second node N2'. The second output sub-circuit 4 is configured to: in response to a control of an electric potential of the second node N2', conduct a second clock signal terminal CB' with the output terminal OUT'. The first switching sub-circuit 5 is configured to: in response to the control of the electric potential of the second node N2', conduct the first clock signal terminal CK' with the first node N1'. The second switching sub-circuit 6 is configured to: in response to the control of the electric potential of the first node N1', conduct the second voltage terminal VH' with the third switching sub-circuit 7. The third switching sub-circuit 7 is configured to: in response to a control of the second clock signal terminal CB', conduct the second switching sub-circuit 6 with the second node N2'. With the shift register unit having the above structure, except for the input stage (the first clock signal terminal CK' provides an active level signal, and the input terminal INPUT' provides an active level signal), only one of the first node N1' and the second node N2' can reach an active level potential in the other stages, so as to realize interlocking of the first output sub-circuit 2 and the second output sub-circuit 4, thereby ensuring that the shift register unit can output an active level signal in the output stage, and output an inactive level signal in the other stages. However, in the above-mentioned shift register unit, each sub-circuit includes at least one transistor, so that the whole shift register unit includes more transistors, and the structure is complex, which is not favorable for increasing a pixel density (Pixels Per Inch, PPI) of the display device.

Figure 2:
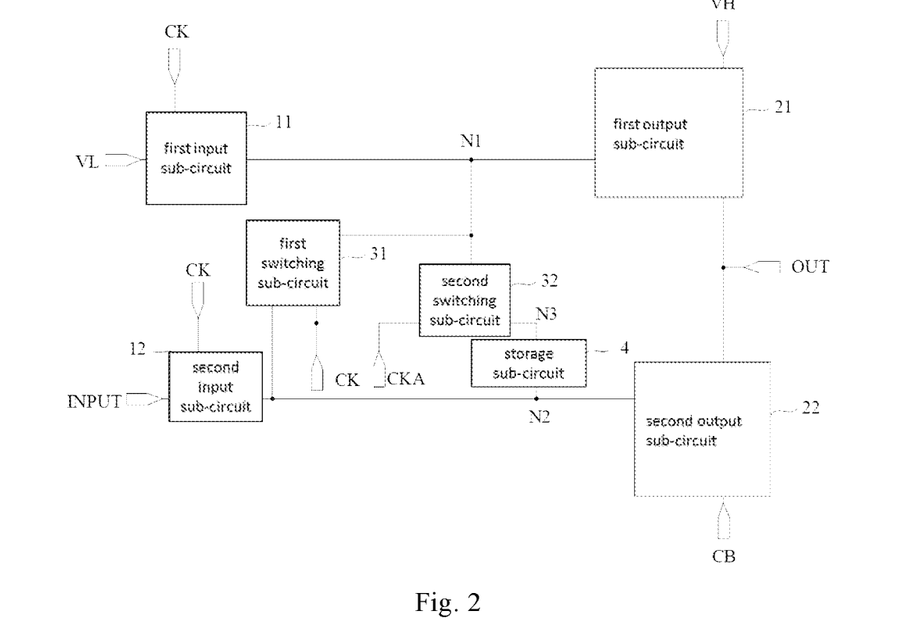
FIG. 2 is an equivalent circuit diagram of a shift register unit according to an embodiment of the present disclosure.

In view of above, an embodiment of the present disclosure provides a shift register unit, and FIG. 2 is an equivalent circuit diagram of a shift register unit provided in the embodiment of the present disclosure, as shown in FIG. 2, the shift register unit includes: a first input sub-circuit 11, a first output sub-circuit 21, a second input sub-circuit 12, a second output sub-circuit 22, a first switching sub-circuit 31, a second switching sub-circuit 32 and a storage sub-circuit 4. The first input sub-circuit 11, the first output sub-circuit 21, the first switching sub-circuit 31, and the second switching sub-circuit 32 are coupled to a first node N1, the second input sub-circuit 12, the second output sub-circuit 22, the first switching sub-circuit 31, and a second terminal of the storage sub-circuit 4 are coupled to a second node N2, and a first terminal of the storage sub-circuit 4 is coupled to the second switching sub-circuit 32. The first input sub-circuit 11 is configured to: in response to a control of the first clock signal terminal CK, conduct a first voltage terminal VL with the first node N1. The first output sub-circuit 21 is configured to: in response to a control of an electric potential of the first node N1, conduct a second voltage terminal VH with an output terminal OUT of the shift register unit. The second input sub-circuit 12 is configured to: in response to the control of the first clock signal terminal CK, conduct an input terminal INPUT of the shift register unit with the second node N2. The second output sub-circuit 22 is configured to: in response to a control of an electric potential of the second node N2, conduct a second clock signal terminal CB with the output terminal OUT of the shift register unit. The first switching sub-circuit 31 is configured to: in response to the control of the electric potential of the second node N2, conduct the first clock signal terminal CK with the first node N1. The second switching sub-circuit 32 is configured to: in response to the control of the electric potential of the first node N1, conduct a third clock signal terminal CKA with the first terminal of the storage sub-circuit 4.

In some implementations, the first clock signal terminal CK and the third clock signal terminal CKA are shared, and the first clock signal terminal CK and the second clock signal terminal CB alternately provide an active level signal.

Figure 3:
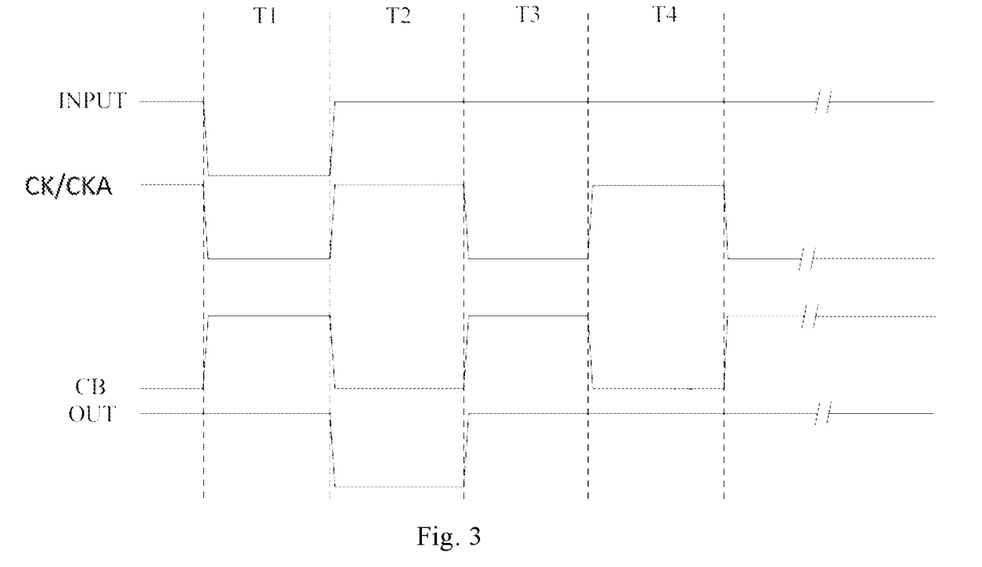
FIG. 3 is a timing diagram illustrating operations of a shift register unit according to an embodiment of the present disclosure.

In the embodiment of the present disclosure, the first voltage terminal VL provides an active level signal, the second voltage terminal VH provides an inactive level signal, and each duty cycle of the shift register unit includes: an input stage T1, an output stage T2, and a first noise reduction stage T3 and a second noise reduction stage T4 between the output stage T2 and the input stage T1 of a next frame. FIG. 3 is a timing diagram illustrating operations of a shift register unit according to an embodiment of the present disclosure, and the operations of the shift register unit according to the embodiment of the present disclosure are described with reference to FIGS. 2 and 3, where a case in which the first clock signal terminal CK and the third clock signal terminal CKA are shared is taken as an example.

In the input stage T1, an active level signal is provided to the first clock signal terminal CK, an inactive level signal is provided to the second clock signal terminal CB, and an active level signal is provided to the input terminal INPUT of the shift register unit. At this time, the first input sub-circuit 11 conducts the first voltage terminal VL with the first node N1, the second input sub-circuit 12 conducts the input terminal INPUT of the shift register unit with the second node N2, both the first node N1 and the second node N2 reach an active level potential, the first output sub-circuit 21 conducts the second voltage terminal VH with the output terminal OUT of the shift register unit, the second output sub-circuit 22 conducts the second clock signal terminal CB with the output terminal OUT of the shift register unit, and the output terminal OUT of the shift register unit outputs an inactive level signal.

In the output stage T2, an active level signal is provided to the second clock signal terminal CB, and an inactive level signal is provided to the first clock signal terminal CK. At this time, the first input sub-circuit 11 cuts off the first voltage terminal VL from the first node N1, the second Input sub-circuit 12 cuts off the input terminal INPUT of the shift register unit from the second node N2, the second node N2 provides an active level signal, the second output sub-circuit 22 conducts the second clock signal terminal CB with the output terminal OUT of the shift register unit, the first switching sub-circuit 31 conducts the first clock signal terminal CK with the first node N1, the first node N1 reaches an inactive level potential, the first output sub-circuit 21 cuts off the second voltage terminal VH from the output terminal OUT of the shift register unit, and the output terminal OUT of the shift register unit outputs an active level signal.

In the first noise reduction stage T3, an inactive level signal is provided to the input terminal INPUT of the shift register unit, an active level signal is provided to the first clock signal terminal CK, and an inactive level signal is provided to the second clock signal terminal CB. At this time, the second input sub-circuit 12 conducts the input terminal INPUT of the shift register unit with the second node N2, the second node N2 reaches an inactive level potential, the first switching sub-circuit 31 cuts off the first clock signal terminal CK from the first node N1, the second output sub-circuit 22 cuts off the second clock signal terminal CB from the output terminal OUT of the shift register unit, the first input sub-circuit 11 conducts the first voltage terminal VL with the first node N1, the first node N1 reaches an active level potential, the second switching sub-circuit 32 conducts the first clock signal terminal CK with the first terminal of the storage sub-circuit 4, the first terminal of the storage sub-circuit 4 (i.e., third node N3 in the figure) reaches an active level potential, the first output sub-circuit 21 conducts the second voltage terminal VH with the output terminal OUT of the shift register unit, and the output terminal OUT of the shift register unit outputs an inactive level signal.

In the second noise reduction stage T4, an active level signal is provided to the second clock signal terminal CB, and an inactive level signal is provided to the first clock signal terminal CK. At this time, the first input sub-circuit 11 cuts off the first voltage terminal VL from the first node N1, the first node N1 holds the active level signal of the previous stage (T3), the first output sub-circuit 21 conducts the second voltage terminal VH with the output terminal OUT of the shift register unit, the second input sub-circuit 12 cuts off the input terminal INPUT of the shift register unit from the second node N2, the second switching sub-circuit 32 conducts the first clock signal terminal CK with the first terminal of the storage sub-circuit 4, the third node N3 reaches an inactive level potential, the second node N2 reaches an inactive level potential, the second output sub-circuit 22 cuts off the second clock signal terminal CB from the output terminal OUT of the shift register unit, and the output terminal OUT of the shift register unit outputs an inactive level signal.

Hereafter, the first noise reduction stage T3 and the second noise reduction stage T4 alternate until the input stage T1 of the next frame.

In summary, in the embodiment of the present disclosure, except for the input stage T1, only one of the first node N1 and the second node N2 can reach the active level potential in the other stages, so as to realize interlocking of the first output sub-circuit 12 and the second output sub-circuit 22, thereby ensuring that the shift register unit can output the active level signal in the output stage T2, and output the inactive level signal in the other stages.

Compared with the shift register unit shown in FIG. 1, the shift register unit of the embodiment of the present disclosure reduces the number of the switching sub-circuits, thereby reducing the number of transistors and facilitating improvement of resolution of a display device.

In the following, the shift register unit according to the embodiment of the present disclosure is described in detail with reference to FIGS. 3 and 4, it should be noted that a transistor in the embodiment of the present disclosure may be a thin film transistor, a field effect transistor, or any other switching device with the same characteristics. A transistor generally includes three electrodes, i.e., a gate electrode, a source electrode, and a drain electrode, and the source electrode and the drain electrode in the transistor are symmetrical in structure, and may be interchanged as desired. In the embodiment of the present disclosure, one of the first electrode and the second electrode is a source electrode and the other is a drain electrode.

Further, transistors can be classified into N-type transistors and P-type transistors according to transistor characteristics. In the present disclosure, an "active level signal" (or "active level potential") refers to a voltage signal (or potential) capable of controlling the corresponding transistor to be turned on, and an "inactive level signal" (or "inactive level potential") refers to a voltage signal (or potential) capable of controlling the corresponding transistor to be turned off; therefore, when the transistor is an N-type transistor, the active level signal refers to a high level signal, and the inactive level signal refers to a low level signal; when the transistor is a P-type transistor, the active level signal refers to a low level signal, and the inactive level signal refers to a high level signal. The embodiment of the present disclosure take the case where the transistors in the shift register unit are all P-type transistors, and the first clock signal terminal CK and the third clock signal terminal CKA are shared as an example.

Figure 4:
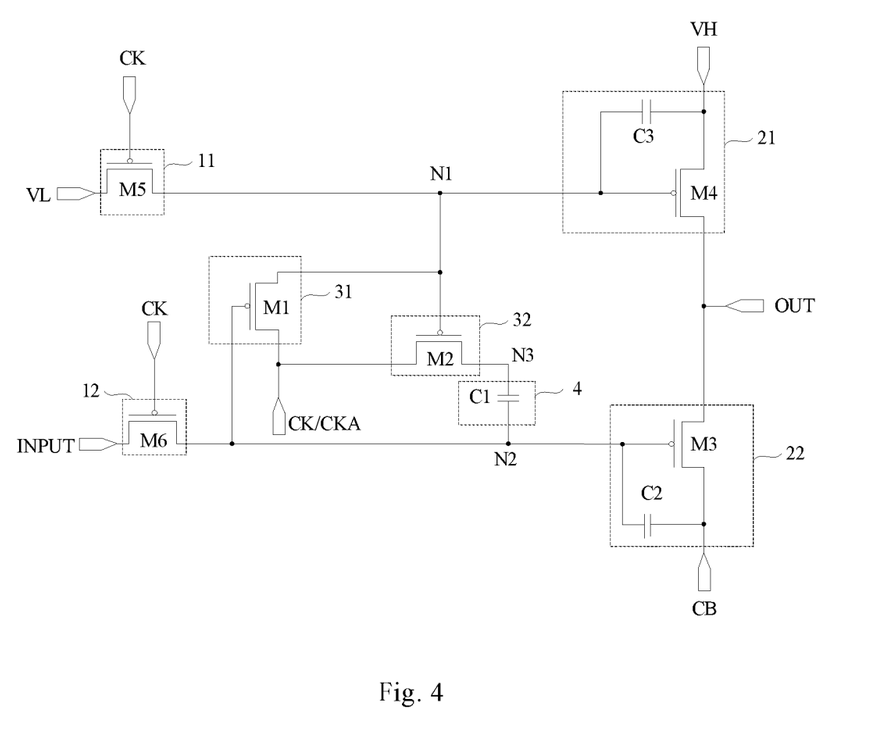
FIG. 4 is a schematic diagram of a specific structure of a shift register unit according to an embodiment of the present disclosure.

FIG. 4 is a schematic diagram of a specific structure of a shift register unit according to an embodiment of the present disclosure, and as shown in FIG. 4, in some implementations, the first switching sub-circuit 31 includes a first switching transistor M1, a first electrode of the first switching transistor M1 is coupled to the first clock signal terminal CK, a second electrode of the first switching transistor M1 is coupled to the first node N1, and a gate electrode of the first switching transistor M1 is coupled to the second node N2. The second switching sub-circuit 32 includes a second switching transistor M2, the storage sub-circuit 4 includes a first capacitor C1, a first electrode of the second switching transistor M2 is coupled to the first clock signal terminal CK, a second electrode of the second switching transistor M2 is coupled to a first terminal of the first capacitor C1, a gate electrode of the second switching transistor M2 is coupled to the first node N1, and a second terminal of the first capacitor C1 is coupled to the second node N2.

In some implementations, the second output sub-circuit 22 includes a second output transistor M3 and a second capacitor C2, a first electrode of the second output transistor M3 and one terminal of the second capacitor C2 are both coupled to the second clock signal terminal CB, a second electrode of the second output transistor M3 is coupled to the output terminal OUT of the shift register unit, and a gate electrode of the second output transistor M3 and another terminal of the second capacitor C2 are both coupled to the second node N2.

In the embodiment of the present disclosure, the second capacitor C2 is coupled between the gate electrode of the second output transistor M3 and the second clock signal terminal CB, so that the voltage of the second node N2 can be further pulled down by bootstrap of the second capacitor C2 in the output stage T2, thereby making the second output transistor M3 fully turned on, and preventing the threshold voltage of the second output transistor M3 from affecting the output of the output terminal OUT of the shift register unit.

In some implementations, the first output sub-circuit 21 includes a first output transistor M4 and a third capacitor C3, a first electrode of the first output transistor M4 and one terminal of the third capacitor C3 are both coupled to the second voltage terminal VH, a second electrode of the first output transistor M4 is coupled to the output terminal OUT of the shift register unit, and a gate electrode of the first output transistor M4 and another terminal of the third capacitor C3 are both coupled to the first node N1.

In some implementations, the first input sub-circuit 11 includes a first input transistor M5, a first electrode of the first input transistor M5 is coupled to the first voltage terminal VL, a second electrode of the first input transistor M5 is coupled to the first node N1, and a gate electrode of the first input transistor M5 is coupled to the first clock signal terminal CK.

In some implementations, the second input sub-circuit 12 includes a second input transistor M6, a first electrode of the second input transistor M6 is coupled to the input terminal INPUT of the shift register unit, a second electrode of the second input transistor M6 is coupled to the second node N2, and a gate electrode of the second input transistor M6 is coupled to the first clock signal terminal CK. In some implementations, the width-to-length ratio of the first switching transistor M1 may be greater or less than the width-to-length ratio of the second switching transistor M2. When the width-to-length ratio of the first switching transistor M1 is greater than that of the second switching transistor M2, the first switching transistor M1 is turned on prior to the second switching transistor M2; when the width-to-length ratio of the first switching transistor M1 is less than that of the second switching transistor M2, the second switching transistor M2 is turned on prior to the first switching transistor M1. In some implementations, the width-to-length ratio of the first switching transistor M1 is greater than the width-to-length ratio of the second switching transistor M2.

Table 1 is a table of voltages of respective nodes at different stages when the width-to-length ratio of the first switching transistor M1 is less than that of the second switching transistor M2, and table 2 is a table of voltages of respective nodes at different stages when the width-to-length ratio of the first switching transistor M1 is greater than that of the second switching transistor M2. Next, with reference to FIGS. 3 and 4, and table 1 and table 2, the operations of the shift register unit will be described when the width-to-length ratio of the first switching transistor M1 is greater than that of the second switching transistor M2, and when the width-to-length ratio of the first switching transistor M1 is less than that of the second switching transistor M2, respectively. Specifically, when the width-to-length ratio of the first switching transistor M1 is less than that of the second switching transistor M2, the operations of the shift register unit are as follows.

In the input stage T1, an active level signal is provided to the first clock signal terminal CK, an inactive level signal is provided to the second clock signal terminal CB, and an active level signal is provided to the input terminal INPUT of the shift register unit, where the voltage of the active level signal is V1 and the voltage of the inactive level signal is Vh. At this time, the first input transistor M5 and the second input transistor M6 are both turned on, the voltages of the first node N1 and the second node N2 are all V1, the first output transistor M4, the second output transistor M3, the first switching transistor M1 and the second switching transistor M2 are all turned on, the voltage of the third node N3 is V1, and the output terminal OUT of the shift register unit outputs an inactive level signal.

In the output stage T2, an inactive level signal is provided to the first clock signal terminal CK, an active level signal is provided to the second clock signal terminal CB, and an inactive level signal is provided to the input terminal INPUT of the shift register unit. At this time, the first input transistor M5 and the second input transistor M6 are both turned off, and since the second switching transistor M2 is turned on prior to the first switching transistor M1, the third node N3 is conducted with the first clock signal terminal CK for a certain time, and the voltage of the third node N3 jumps from V1 to Vh within a certain time, and the first clock signal terminal CK, the first capacitor C1, the second capacitor C2 and the second clock signal terminal CB at this time are coupled in series, and the first capacitor C1 and the second capacitor C2 divide the voltage, so that the voltage of the second node N2 jumps from V1 to V1+(Vh−V1)*C1'/(C1'+C2'). Since the second clock signal terminal CB changes from the inactive level signal to the active level signal, the voltage of the second node N2 is further pulled down by bootstrap of the second capacitor C2, so that the voltage of the second node N2 jumps from V1+(Vh−V1)*C1'/(C1'+C2') to V1+(Vh−V1)*C1'/(C1'+C2')+V1−Vh, and when V1+(Vh−V1)*C1'/(C1'+C2')+V1−Vh is less than a voltage which enables the second output transistor M3 to be turned on, the second output transistor M3 is turned on, and the output terminal OUT of the shift register unit is conducted with the second clock signal terminal CB, thereby outputs the active level signal. C1' is a capacitance of the first capacitor C1, and C2' is a capacitance of the second capacitor C2. The first switching transistor M1 being turned on makes the voltage of the first node N1 jump from V1 to Vh, at this time, the first output transistor M4 is turned off, the second switching transistor M2 is turned off, and since the voltage of the second node N2 is further pulled down by bootstrap of the second capacitor C2, the voltage of the third node N3 is also pulled down by bootstrap of the first capacitor C1, and jumps from Vh to V1.

In the first noise reduction stage T3, an active level signal is provided to the first clock signal terminal CK, and an inactive level signal is provided to the second clock signal terminal CB and the input terminal INPUT of the shift register unit. At this time, since the second clock signal terminal CB changes from the active level signal to the inactive level signal, the voltage of the second node N2 jumps from V1+(Vh−V1)*C1'/(C1'+C2')+V1−Vh to V1+(Vh−V1)*C1'/(C1'+C2') under bootstrap of the second capacitor C2, and the voltage of the third node N3 jumps from V1 to Vh under bootstrap of the first capacitor C1. The first input transistor M5 is turned on, the voltage of the first node N1 jumps from Vh to V1, the first output transistor M4 is turned on, and the output terminal OUT of the shift register unit is conducted with the second voltage terminal Vh, thereby outputs an inactive level signal. In addition, the second switching transistor M2 is turned on, and the third node N3 is conducted with the first clock signal terminal CK, so that the voltage of the third node N3 jumps from Vh to V1. The second input transistor M6 is turned on, the second node N2 is conducted with the input terminal INPUT of the shift register unit, the voltage of the second node N2 jumps from V1+(Vh−V1)*C1'/(C1'+C2') to Vh, the first switching transistor M1 is turned off, and the second output transistor M3 is turned off.

In the second noise reduction stage T4, an inactive level signal is provided to the first clock signal terminal CK and the input terminal INPUT of the shift register unit, and an active level signal is provided to the second clock signal terminal CB. At this time, the first input transistor M5, the second input transistor M6, and the first switching transistor M1 are all turned off, the first node N1 maintains the voltage V1 at the previous stage, the first output transistor M4 is turned on, and the output terminal OUT of the shift register unit is conducted with the second voltage terminal VH, thereby outputs an inactive level signal. The second switching transistor M2 is turned on, the voltage of the third node N3 jumps from V1 to Vh, the first clock signal terminal CK, the first capacitor C1, the second capacitor C2 and the second clock signal terminal CB are coupled in series at this time, the first capacitor C1 and the second capacitor C2 divide the voltage, and the voltage of the second node N2 jumps from Vh to Vh+(Vh−V1)*C1'/(C1'+C2') under bootstrap of the first capacitor C1, and since the voltage of the second node N2 changes from the inactive level signal to the active level signal at this time, the voltage of the second node N2 jumps from Vh+(Vh−V1)*C1'/(C'+C2') to Vh+(Vh−V1)*(C1'−C2')/(C1'+C2') under bootstrap of the second capacitor C2 again. When Vh+(Vh−V1)*(C1'−C2')/(C1'+C2') is greater than the voltage which enables the second output transistor M3 to be turned on, the second output transistor M3 is turned off.

When the width-to-length ratio of the first switching transistor M1 is greater than that of the second switching transistor M2, the shift register unit operates as follows.

In the input stage T1, an active level signal is provided to the first clock signal terminal CK, an inactive level signal is provided to the second clock signal terminal CB, and an active level signal is provided to the input terminal INPUT of the shift register unit, where the voltage of the active level signal is V1 and the voltage of the inactive level signal is Vh. At this time, the first input transistor M5 and the second input transistor M6 are both turned on, the voltages of the first node N1 and the second node N2 are all V1, the first output transistor M4, the second output transistor M3, the first switching transistor M1 and the second switching transistor M2 are all turned on, the voltage of the third node is V1, and the output terminal OUT of the shift register unit outputs an inactive level signal.

In the output stage T2, an inactive level signal is provided to the first clock signal terminal CK, an active level signal is provided to the second clock signal terminal CB, and an inactive level signal is provided to the input terminal INPUT of the shift register unit. At this time, the first input transistor M5 and the second input transistor M6 are both turned off, the voltage of the second node N2 is further pulled down under bootstrap of the second capacitor C2, and jumps from V1 to 2V1−Vh, the second output transistor M3 is fully turned on, and the output terminal OUT of the shift register unit outputs an active level signal. Since the first switching transistor M1 is turned on prior to the second switching transistor M2, the voltage of the first node N1 jumps from V1 to Vh, the first output transistor M4 is turned off, the second switching transistor M2 is turned off, and the voltage of the third node N3 jumps from V1 to 2V1−Vh under bootstrap of the first capacitor C1.

In the first noise reduction stage T3, an active level signal is provided to the first clock signal terminal CK, an inactive level signal is provided to the second clock signal terminal CB, and an inactive level signal is provided to the Input terminal INPUT of the shift register unit. At this time, since the second clock signal terminal CB changes from the active level signal to the inactive level signal, the voltage of the second node N2 jumps from 2V1−Vh to V1 under bootstrap of the second capacitor C2. The first input transistor M5 is turned on, the voltage of the first node N1 jumps from Vh to V1, the first output transistor M4 is turned on, the output terminal OUT of the shift register unit is conducted with the second voltage terminal VH, thereby outputs an inactive level signal, the second switching transistor M2 is turned on,
the voltage of the third node N3 jumps from Vh to V1, the second input transistor M6 is turned on, the voltage of the second node N2 jumps from V1 to Vh, the first switching transistor M1 is turned off, and the second output transistor M3 is turned off.

In the second noise reduction stage T4, an inactive level signal is provided to the first clock signal terminal CK and the input terminal INPUT of the shift register unit, and an active level signal is provided to the second clock signal terminal CB. At this time, the first input transistor M5, the second input transistor M6, and the first switching transistor M1 are all turned off, the first node N1 maintains the voltage V1 at the previous stage, the first output transistor M4 is turned on, and the output terminal OUT of the shift register unit is conducted with the second voltage terminal VH, thereby outputs an inactive level signal. The second switching transistor M2 is turned on, the voltage of the third node N3 jumps from V1 to Vh, the first clock signal terminal CK, the first capacitor C1, the second capacitor C2 and the second clock signal terminal CB are coupled in series at this time, the first capacitor C1 and the second capacitor C2 divide the voltage, and the voltage of the second node N2 jumps from Vh to Vh+(Vh−V1)*C1'/(C1'+C2') under bootstrap of the first capacitor C1, and since the voltage of the second clock signal terminal CB changes from the inactive level signal to the active level signal at this time, the voltage of the second node N2 jumps from Vh+(Vh−V1)*C1'/(C1'+C2') to Vh+(Vh−V1)*(C1'−C2')/(C1'+C2') under bootstrap of the second capacitor C2 again. When Vh+(Vh−V1)*(C1'−C2')/(C1'+C2') is greater than the voltage which enables the second output transistor M3 to be tuned on, the second output transistor M3 is turned off.

In summary, when the width-to-length ratio of the first switching transistor M1 is less than that of the second switching transistor M2, in the output stage T2, in order to make the voltage V1+(Vh−V1)*C1'/(C1'+C2')+V1−Vh of the second node N2 less than the voltage which enables the second output transistor M3 to be turned on, the capacitance of the first capacitor C1 needs to be much less than that of the second capacitor C2, and at the same time, when selecting the first capacitor C1 and the second capacitor C2, it needs to ensure that, in the second noise reduction stage T4, Vh+(Vh−V1)*(C1'−C2')/(C1'+C2') is greater than the voltage which enables the second output transistor M3 to be turned on, so as to ensure that the second output transistor M3 is turned off in the second noise reduction stage T4.

When the width-to-length ratio of the first switching transistor M1 is greater than that of the second switching transistor M2, it is only necessary to make the capacitance of the first capacitor C1 greater than that of the second capacitor C2, so as to ensure that the second input transistor M6 is turned on in the output stage T2 and turned off in the second noise reduction stage T4, so that the output terminal OUT of the shift register unit outputs an active level signal in the output stage T2 and outputs an inactive level signal in the second noise reduction stage T4, compared with a solution in which the width-to-length ratio of the first switching transistor M1 is less than that of the second switching transistor M2, when the width-to-length ratio of the first switching transistor M1 is greater than that of the second switching transistor M2, the first capacitor C1 and the second capacitor C2 can be selected from a wider range and the design is more flexible.

TABLE 1

| stage | N1 | N2 | N3 | OUT |
|---|---|---|---|---|
| T1 | Vl | Vl | Vl | Vh |
| T2 | Vh | Vl + (Vh − Vl)*C1'/(C1' + C2') + Vl − Vh | Vl | Vl |
| T3 | Vl | Vh | Vl | Vh |
| T4 | Vl | Vh + (Vh − Vl)*(C1' − C2')/(C1' + C2') | Vh | Vh |

TABLE 2

| stage | N1 | N2 | N3 | OUT |
|---|---|---|---|---|
| T1 | Vl | Vl | Vl | Vh |
| T2 | Vh | 2Vl − Vh | 2Vl − Vh | Vl |
| T3 | Vl | Vh | Vl | Vh |
| T4 | Vl | Vh + (Vh − Vl)*(C1' − C2')/(C1' + C2') | Vh | Vh |

By adopting the shift register unit of the embodiment of the present disclosure, the normal operations of the shift register unit can be realized only by six transistors at least, so that the occupied area of the shift register unit in the display device is small, and the improvement of pixel density of the display device is facilitated.

The present disclosure further provides a method for driving the shift register unit in the above embodiment, the first voltage terminal provides an active level signal, the second voltage terminal provides an inactive level signal, and the first clock signal terminal CK and the third clock signal terminal CKA are shared, and the method includes the following stages T1 to T4.

In the input stage T1, an active level signal is provided to the first clock signal terminal and an active level signal is provided to the input terminal of the shift register unit, so that the first input sub-circuit 11 conducts the first voltage terminal VL with the first node N1, and the second input sub-circuit 12 conducts the input terminal INPUT of the shift register unit with the second node N2.

In the output stage T2, an active level signal is provided to the second clock signal terminal CB and an inactive level signal is provided to the first clock signal terminal CK, so that the first switching sub-circuit 31 conducts the first clock signal terminal CK with the first node N1, the first output sub-circuit 21 cuts off the second voltage terminal VH from the output terminal OUT of the shift register unit, and the second output sub-circuit 22 conducts the second clock signal terminal CB with the output terminal OUT of the shift register unit.

In the first noise reduction stage T3, an inactive level signal is provided to the input terminal INPUT of the shift register unit, an active level signal is provided to the first clock signal terminal CK, and an inactive level signal is provided to the second clock signal terminal CB, so that the first input sub-circuit 11 conducts the first voltage terminal VL with the first node N1, the second input sub-circuit 12 conducts the input terminal INPUT of the shift register unit with the second node N2, the first output sub-circuit 21 conducts the second voltage terminal VH with the output terminal OUT of the shift register unit, the second output sub-circuit 22 cuts off the second clock signal terminal CB from the output terminal OUT of the shift register unit, the first switching sub-circuit 31 cuts off the first clock signal terminal CK from the first node N1, and the second switching sub-circuit 32 conducts the first clock signal terminal CK with the first terminal of the storage sub-circuit 4.

In the second noise reduction stage T4, an active level signal is provided to the second clock signal terminal CB, and an inactive level signal is provided to the first clock signal terminal CK, so that the first input sub-circuit 11 cuts off the first voltage terminal VL from the first node N1, the second input sub-circuit 12 cuts off the input terminal INPUT of the shift register unit from the second node N2, the second switching sub-circuit 32 conducts the first clock signal terminal CK with the first terminal of the storage sub-circuit 4, the first output sub-circuit 21 conducts the second voltage terminal VH with the output terminal OUT of the shift register unit, and the second output sub-circuit 22 cuts off the second clock signal terminal CB from the output terminal OUT of the shift register unit.

The specific operations of the shift register unit have been described in the above embodiment, and will not be described herein again.

Figure 5:
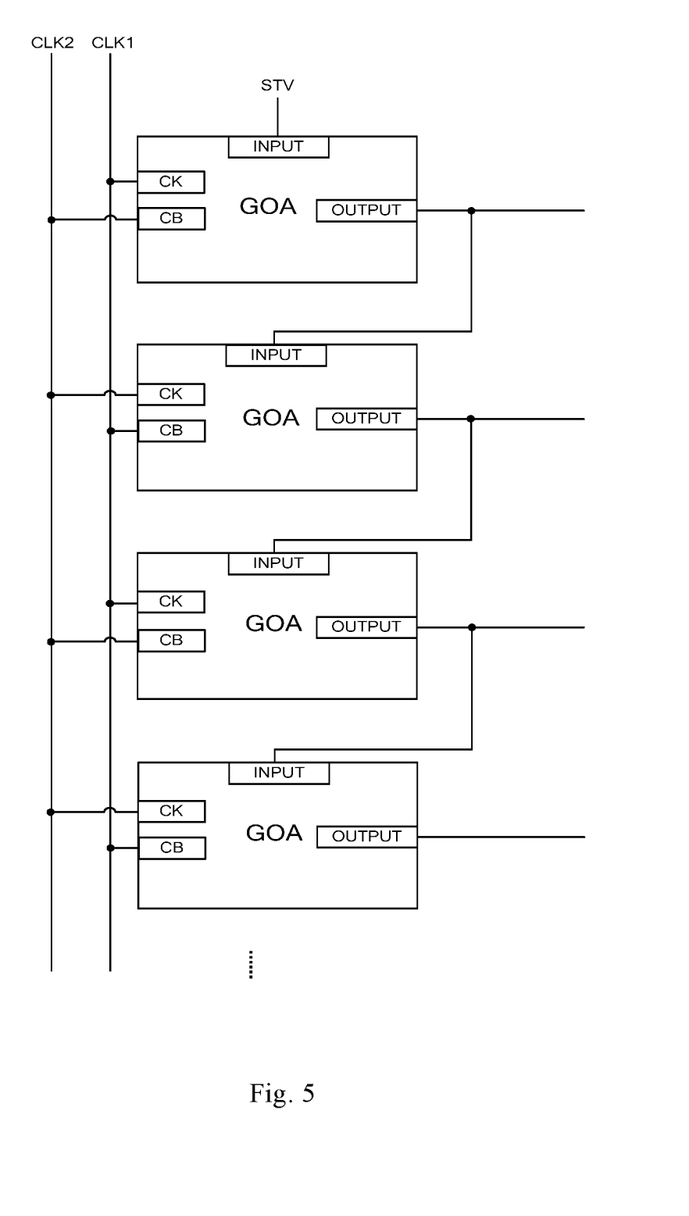
FIG. 5 is a schematic structural diagram of a gate driving circuit according to an embodiment of the present disclosure.

FIG. 5 is a schematic structural diagram of a gate driving circuit in an embodiment of the present disclosure, and as shown in FIG. 5, the gate driving circuit includes a plurality of shift register units GOA, where each of the shift register units GOA is the shift register unit in the above embodiment. The input terminal INPUT of the shift register unit GOA of the first stage is coupled to a start signal terminal STV, and except for the shift register unit GOA of the first stage, the input terminal INPUT of the shift register unit GOA of each stage is coupled to the output terminal OUT of the shift register unit GOA of the previous stage. In the embodiment of the present disclosure, if the first clock signal terminal CK and the third clock signal terminal CKA in the shift register unit are shared, the gate driving circuit further includes two clock signal lines CLK1 and CLK2, first clock signal terminals CK of any two adjacent shift register units GOA are coupled to different clock signal lines respectively, second clock signal terminals CB of any two adjacent shift register units GOA are coupled to different clock signal lines respectively, and the first clock signal terminal CK and the second clock signal terminal CB of the same shift register unit GOA are coupled to different clock signal lines.

It should be understood that if the first clock signal terminal CK and the third clock signal terminal CKA in the shift register unit are not shared, the gate driving circuit may include three clock signal lines, for example, third clock signal terminals CKA of any two adjacent shift register units GOA may be coupled to different clock signal lines, which will not be described in detail herein.

The present disclosure further provides a display device including the gate driving circuit in the above embodiment.

The display device may be: any product or component with a display function, such as electronic paper, an OLED panel, a mobile phone, a tablet computer, a television, a display, a notebook computer, a digital photo frame, a navigator and the like.

It will be understood that the above implementations are merely exemplary implementations employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A shift register unit, comprising: a first input sub-circuit, a first output sub-circuit, a second input sub-circuit, a second output sub-circuit, a first switching sub-circuit, a second switching sub-circuit and a storage sub-circuit, the first input sub-circuit, the first output sub-circuit, the first switching sub-circuit and the second switching sub-circuit are coupled to a first node, the second input sub-circuit, the second output sub-circuit, the first switching sub-circuit and a second terminal of the storage sub-circuit are coupled to a second node, and a first terminal of the storage sub-circuit is coupled to the second switching sub-circuit;

the first input sub-circuit is configured to: in response to a control of a first clock signal terminal, conduct a first voltage terminal with the first node;

the first output sub-circuit is configured to: in response to a control of an electric potential of the first node, conduct a second voltage terminal with an output terminal of the shift register unit;

the second input sub-circuit is configured to: in response to a control of a first clock signal terminal, conduct an input terminal of the shift register unit with the second node;

the second output sub-circuit is configured to: in response to a control of an electric potential of the second node, conduct a second clock signal terminal with the output terminal of the shift register unit;

the first switching sub-circuit is configured to: in response to the control of the electric potential of the second node, conduct the first clock signal terminal with the first node;

the second switching sub-circuit is configured to: in response to a control of the electric potential of the first node, conduct a third clock signal terminal with the first terminal of the storage sub-circuit, wherein the first clock signal terminal is shared with the third clock signal terminal, and the first clock signal terminal and the second clock signal terminal alternately provide an active level signal.

2. The shift register unit of claim 1, wherein the first switching sub-circuit comprises a first switching transistor, a first electrode of the first switching transistor is coupled to the first clock signal terminal, a second electrode of the first switching transistor is coupled to the first node, and a gate electrode of the first switching transistor is coupled to the second node;

the second switching sub-circuit comprises a second switching transistor, the storage sub-circuit comprises a first capacitor, a first electrode of the second switching transistor is coupled to the third clock signal terminal, a second electrode of the second switching transistor is coupled to a first terminal of the first capacitor, a gate electrode of the second switching transistor is coupled to the first node, and a second terminal of the first capacitor is coupled to the second node.

3. The shift register unit of claim 2, wherein a width-to-length ratio of the first switching transistor is greater than a width-to-length ratio of the second switching transistor.

4. The shift register unit of claim 1, wherein the second output sub-circuit comprises a second output transistor and a second capacitor, a first electrode of the second output transistor and one terminal of the second capacitor are both coupled to the second clock signal terminal, a second electrode of the second output transistor is coupled to the output terminal of the shift register unit, and a gate electrode of the second output transistor and another terminal of the second capacitor are both coupled to the second node.

5. The shift register unit of claim 1, wherein the first output sub-circuit comprises a first output transistor and a third capacitor, a first electrode of the first output transistor and the second voltage terminal are both coupled to one terminal of the third capacitor, a second electrode of the first output transistor is coupled to the output terminal of the shift register unit, and a gate electrode of the first output transistor and another terminal of the third capacitor are both coupled to the first node.

6. The shift register unit of claim 2, wherein the first output sub-circuit comprises a first output transistor and a third capacitor, a first electrode of the first output transistor and the second voltage terminal are both coupled to one terminal of the third capacitor, a second electrode of the first output transistor is coupled to the output terminal of the shift register unit, and a gate electrode of the first output transistor and another terminal of the third capacitor are both coupled to the first node.

7. The shift register unit of claim 4, wherein the first output sub-circuit comprises a first output transistor and a third capacitor, a first electrode of the first output transistor and the second voltage terminal are both coupled to one terminal of the third capacitor, a second electrode of the first output transistor is coupled to the output terminal of the shift register unit, and a gate electrode of the first output transistor and another terminal of the third capacitor are both coupled to the first node.

8. The shift register unit of claim 1, wherein the first input sub-circuit comprises a first input transistor having a first electrode coupled to the first voltage terminal, a second electrode coupled to the first node, and a gate electrode coupled to the first clock signal terminal.

9. The shift register unit of claim 2, wherein the first input sub-circuit comprises a first input transistor having a first electrode coupled to the first voltage terminal, a second electrode coupled to the first node, and a gate electrode coupled to the first clock signal terminal.

10. The shift register unit of claim 4, wherein the first input sub-circuit comprises a first input transistor having a first electrode coupled to the first voltage terminal, a second electrode coupled to the first node, and a gate electrode coupled to the first clock signal terminal.

11. The shift register unit of claim 1, wherein the second input sub-circuit comprises a second input transistor having a first electrode coupled to the input terminal of the shift register unit, a second electrode coupled to the second node, and a gate electrode coupled to the first clock signal terminal.

12. The shift register unit of claim 2, wherein the second input sub-circuit comprises a second input transistor having a first electrode coupled to the input terminal of the shift register unit, a second electrode coupled to the second node, and a gate electrode coupled to the first clock signal terminal.

13. A shift register unit, comprising a first input transistor, a second input transistor, a first output transistor, a second output transistor, a first switching transistor, a second switching transistor, a first capacitor, a second capacitor and a third capacitor, a first electrode of the first input transistor is coupled to a first voltage terminal, a second electrode of the first input transistor is coupled to a first node, a gate electrode of the first input transistor is coupled to a first clock signal terminal, a first electrode of the second input transistor is coupled to an input terminal of the shift register unit, a second electrode of the second input transistor is coupled to a second node, a gate electrode of the second input transistor is coupled to the first clock signal terminal, a first electrode of the first output transistor and one terminal of the third capacitor are both coupled to a second voltage terminal, a second electrode of the first output transistor is coupled to an output terminal of the shift register unit, a gate electrode of the first output transistor and another terminal of the third capacitor are both coupled to the first node, a first electrode of the second output transistor and one terminal of the second capacitor are both coupled to a second clock signal terminal, a second electrode of the second output transistor is coupled to the output terminal of the shift register unit, a gate electrode of the second output transistor and another terminal of the second capacitor are both coupled to the second node, a first electrode of the first switching transistor is coupled to the first clock signal terminal, a second electrode of the first switching transistor is coupled to the first node, a gate electrode of the first switching transistor is coupled to the second node, a first electrode of the second switching transistor is coupled to a third clock signal terminal, a second electrode of the second switching transistor is coupled to a first terminal of the first capacitor, a gate electrode of the second switching transistor is coupled to the first node, a second terminal of the first capacitor is coupled to the second node, the first clock signal terminal and the third clock signal terminal are shared.

14. A method for driving the shift register unit of claim 1, wherein the first voltage terminal provides an active level signal, the second voltage terminal provides an inactive level signal, and the first clock signal terminal and the third clock signal terminal are shared, the method comprising:

in an input stage, providing an active level signal to the first clock signal terminal and providing an active level signal to the input terminal of the shift register unit, so that the first input sub-circuit conducts the first voltage terminal with the first node, and the second input sub-circuit conducts the input terminal of the shift register unit with the second node;

in an output stage, providing an active level signal to the second clock signal terminal and providing an inactive level signal to the first clock signal terminal, so that the first switching sub-circuit conducts the first clock signal terminal with the first node, the first output sub-circuit cuts off the second voltage terminal from the output terminal of the shift register unit, and the second output sub-circuit conducts the second clock signal terminal with the output terminal of the shift register unit;

in a first noise reduction stage, providing an inactive level signal to the input terminal of the shift register unit, providing an active level signal to the first clock signal terminal, and providing an inactive level signal to the second clock signal terminal to cause the first input sub-circuit to conduct the first voltage terminal with the first node, the second input sub-circuit conducts the input terminal of the shift register unit with the second node, the first output sub-circuit conducts the second voltage terminal with the output terminal of the shift register unit, the second output sub-circuit cuts off the second clock signal terminal from the output terminal of the shift register unit, the first switching sub-circuit cuts off the first clock signal terminal from the first node, and the second switching sub-circuit conducts the first clock signal terminal with the first terminal of the storage sub-circuit;

in a second noise reduction stage, providing an active level signal to the second clock signal terminal, and providing an inactive level signal to the first clock signal terminal, so that the first input sub-circuit cuts off the first voltage terminal from the first node, the second input sub-circuit cuts off the input terminal of the shift register unit from the second node, the second switching sub-circuit conducts the first clock signal terminal with the first terminal of the storage sub-circuit, the first output sub-circuit conducts the second voltage terminal with the output terminal of the shift register unit, and the second output sub-circuit cuts off the second clock signal terminal from the output terminal of the shift register unit.

15. A gate driving circuit, comprising a plurality of shift register units, and at least one of the shift register units is the shift register unit of claim 1, wherein the input terminal of the shift register unit of a first stage is coupled to a start signal terminal, and the input terminal of the shift register unit of each stage, except the shift register unit of the first stage, is coupled to the output terminal of the shift register unit of a previous stage.

16. A display device, comprising the gate driver circuit of claim 15.

* * * * *